(12) United States Patent
Hattori

(10) Patent No.: US 6,693,987 B1
(45) Date of Patent: Feb. 17, 2004

(54) DIGITAL-TO-ANALOG DAC-DRIVEN PHASE-LOCKED LOOP PLL WITH SLAVE PLL'S DRIVING DAC REFERENCE VOLTAGES

(75) Inventor: Hide Hattori, Palo Alto, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 639 days.

(21) Appl. No.: 09/679,682

(22) Filed: Oct. 5, 2000

(51) Int. Cl.$^7$ .................................................. H03D 3/24
(52) U.S. Cl. ........................................ 375/376; 327/156
(58) Field of Search ................................ 375/215, 294, 375/327, 373, 374, 375, 376; 327/55, 58, 68, 90, 3, 5, 16, 37, 40, 147, 156, 157; 329/306, 307, 359, 358, 360; 331/25, 2, 11

(56) References Cited

U.S. PATENT DOCUMENTS

| | | | |
|---|---|---|---|
| 4,516,084 A | | 5/1985 | Crowley ........................ 331/2 |
| 4,724,476 A | * | 2/1988 | Nakagawa et al. .......... 348/453 |
| 5,231,475 A | * | 7/1993 | Ritter et al. ................. 348/578 |
| 5,262,957 A | | 11/1993 | Hearn ......................... 364/485 |
| 5,329,251 A | | 7/1994 | Llewellyn ...................... 331/2 |
| 5,422,604 A | * | 6/1995 | Jokura ........................... 331/2 |
| 5,479,073 A | | 12/1995 | Mamiya et al. .......... 315/169.3 |
| 5,566,204 A | * | 10/1996 | Kardontchik et al. ....... 375/219 |
| 5,572,168 A | * | 11/1996 | Kasturia ........................ 331/2 |
| 5,610,558 A | * | 3/1997 | Mittel et al. ................... 331/2 |
| 5,659,586 A | | 8/1997 | Chun ........................... 375/355 |
| 5,809,397 A | * | 9/1998 | Harthcock et al. ......... 455/13.2 |
| 5,838,205 A | * | 11/1998 | Ferraiolo et al. ............... 331/2 |
| 5,881,111 A | | 3/1999 | Anzai ......................... 375/327 |
| 5,943,382 A | * | 8/1999 | Li et al. ...................... 375/376 |
| 5,950,115 A | * | 9/1999 | Momtaz et al. ............... 455/73 |
| 6,064,869 A | * | 5/2000 | Davis et al. ................ 455/260 |
| 6,097,560 A | * | 8/2000 | Tanaka et al. ................ 360/51 |
| 6,115,586 A | * | 9/2000 | Bezzam et al. ............. 455/112 |
| 6,188,258 B1 | * | 2/2001 | Nakatani ..................... 327/157 |
| 6,204,732 B1 | * | 3/2001 | Rapoport et al. .............. 331/2 |
| 6,570,948 B1 | * | 5/2003 | Marshall ..................... 375/376 |

* cited by examiner

Primary Examiner—Emmanuel Bayard
(74) Attorney, Agent, or Firm—Stuart T. Auvinen

(57) ABSTRACT

A clock generator uses two PLL loops and a digital-to-analog converter (DAC) to generate a variable output frequency from a single fixed-frequency reference clock. Each PLL loop receives the reference clock and phase-compares it with a feedback clock. The feedback clock in one loop is slightly faster in frequency than the feedback clock in the second loop. The input voltages to voltage-controlled oscillators (VCOs) in the two loops thus vary slightly. A DAC is connected between the two VCO inputs. The DAC's two reference-voltage inputs are connected to these VCO inputs. The DAC's output voltage is selected from within the voltage range between the two VCO voltages by a digital code-word input to the DAC. The DAC's output voltage is input to a final VCO that generates the variable output frequency. The output frequency is varied by selecting the digital code-word input to the DAC.

20 Claims, 3 Drawing Sheets

DIGITAL-TO-ANALOG DAC-DRIVEN PHASE-LOCKED LOOP PLL WITH SLAVE PLL'S DRIVING DAC REFERENCE VOLTAGES

FIELD OF THE INVENTION

This invention relates to Phase-locked loops (PLL's), and more particularly to digitally-tuned dual PLL's.

BACKGROUND OF THE INVENTION

Accurate clocks are often used to synchronize the timing of operations and data transfers. A crystal oscillator can be used to generate a clock at a base frequency, which is then divided or multiplied to create one or more clocks with desired frequencies. External clock can be received and likewise divided or multiplied to produce internal clocks.

Clocks are typically generated from oscillator outputs using phase-locked loops (PLL's). PLLs are one of the most widely use building blocks in digital systems today. See for example, U.S. Pat. No. 6,124,741 by Arcus, and assigned to Pericom Semiconductor Corp. of San Jose, Calif.

FIG. 1 illustrates a typical PLL. Phase detector 10 receives a reference-clock input from an external oscillator or clock source. The phase and frequency of the reference clock is compared to the phase and frequency of a feedback clock generated by voltage-controlled oscillator (VCO) 14. The feedback clock can be the output clock generated by the PLL, or a divided-down derivative of the output clock from VCO 14.

Phase detector 10 outputs up and down signals UP, DN when the phase or frequency of one input does not match the phase or frequency of the other input. These up and down signals cause charge pump 12 to add or remove charge from filter capacitor 19, which integrates the charge. As charge is added or removed from filter capacitor 19, the voltage input to VCO 14 is increased or decreased. VCO 14 responds by increasing or decreasing the frequency of the output clock. The feedback clock to phase detector 10 is likewise changed by VCO 14.

As charge pump 12 adds or removes charge from filter capacitor 19, altering control voltage $V_{CTL}$ input to VCO 14, the phase and frequency of the feedback clock are adjusted until the reference clock is matched. Then phase detector 10 stops generating up and down signals to charge pump 12, until charge leaks off filter capacitor 19 or the reference clock changes.

Often the reference or input frequency is not exactly the same as the desired output frequency. The reference frequency may be divided or multiplied to obtain the output frequency, but the desired output frequency may still not be a multiple or divisor of the reference frequency. For example, the desired frequency may be an abstract frequency completely unrelated to the reference frequency. In the past, the system designer chose the reference frequency to be an exact multiple or divisor of the desired frequency.

Various PLL's with multiple loops have been developed. See U.S. Pat. No. 5,943,382 by Li et al., U.S. Pat. No. 5,393,250 by Imaizumi et al., U.S. Pat. No. 5,075,639 by Taya, and U.S. Pat. No. 5,317,284 by Yang. While useful, a dual-loop PLL that outputs a clock with a finely-adjustable frequency is desired.

A widely used building-block is the digital-to-analog converter (DAC). DAC's have been used at interfaces between digital and analog parts of a system, such as for converting digital codes to analog voltages. A variety of real-world analog devices such as audio speakers, motors, video displays, and phone lines can then be driven. While useful in such applications, DAC's are not generally used for generating clock signals. However, see U.S. Pat. No. 5,881,111 by Anzai, which uses a pair of D/A and A/D converters in a loop in a frequency sweep circuit. Also see U.S. Pat. No. 5,329,251 by Llewellyn, which teaches a DAC used with a multiple-PLL clock recovery circuit.

In some applications, it is desired to finely-tune the output frequency. Digital tuning of the output frequency is desired. It is desired to use a digital code word to select from a range of possible output frequencies. It is useful to digitally tune the output frequency without requiring any change to the reference frequency. Digital adjustment of the output frequency is desirable. A PLL that uses a fixed reference frequency input, but that can generate a range of finely-tuned output frequencies, is desirable.

DETAILED DESCRIPTION

The present invention relates to an improvement in digitally-tuned PLL's. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that a finely-tuned clock can be generated from two PLL loops with slightly different frequencies. The frequency of each loop depends on a voltage input to the loop's voltage-controlled oscillator (VCO). The VCO voltage input for the two loops with slightly different output frequencies differ in voltage from each other.

The inventor realizes that a digital-to-analog converter (DAC) can be coupled between the two loops. The DAC has two reference voltages, +Vref and −Vref, and generates an output voltage between +Vref and −Vref. The exact output voltage depends on an input digital code-word that indicates a fraction of the reference-voltage range.

The DAC is coupled between the two loop's VCO inputs. The VCO input voltages are applied to the DAC's reference-voltage inputs +Vref and −Vref. The DAC generates an output voltage that is selectable with the digital code-word input. The voltage output by the DAC is fed to a third VCO that generates the digitally-tuned output clock.

The DAC's output voltage is a voltage between the two loop's VCO voltages, and thus generates a frequency that is between the frequency of the two loops. The inventor realizes exact output voltage of the DAC can be selected by the digital code-word to get the voltage that produces the exact frequency desired.

Figure 1:
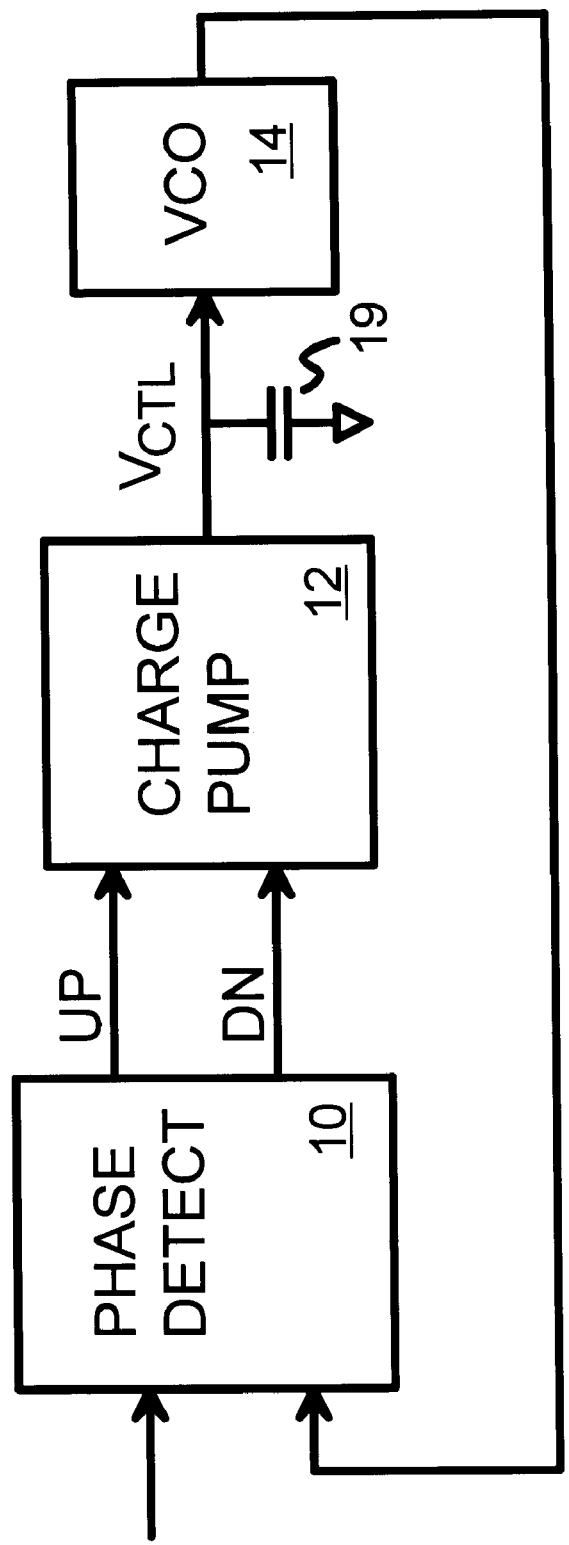
FIG. 1 illustrates a typical PLL.
Figure 2:
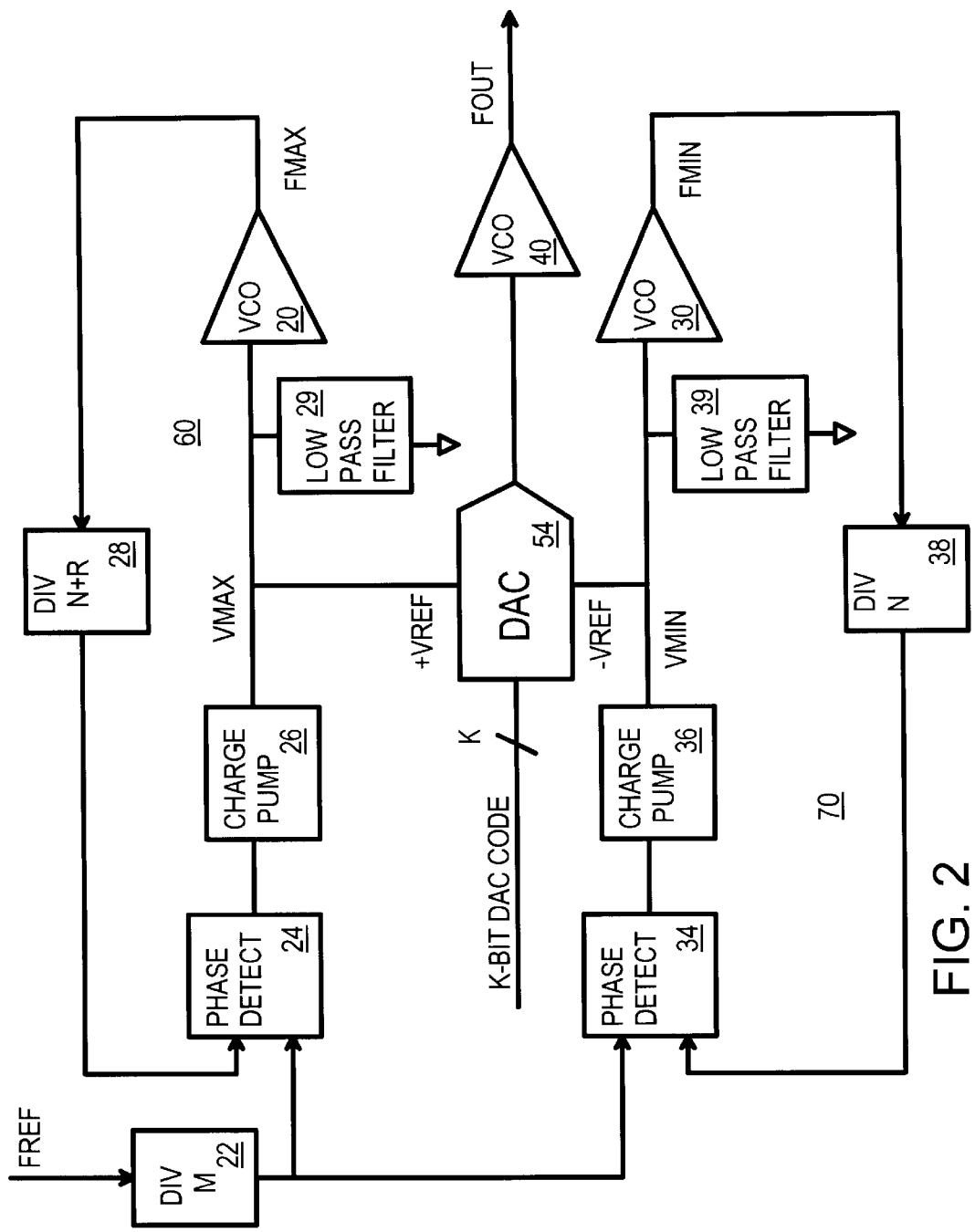
FIG. 2 is a diagram of a dual-PLL clock generator with a DAC that generates a final VCO voltage.

FIG. 2 is a diagram of a dual-PLL clock generator with a DAC that generates a final VCO voltage. A reference clock FREF having a fixed reference frequency is input to input divider 22. Input divider 22 is optional, but allows the reference frequency to be divided by M. The divided clock of frequency FREF/M is applied to phase detectors 24, 34 of loops 60, 70.

Phase detector 24 in PLL loop 60 compares the divided reference clock with a loop feedback clock from divider 28. The phase difference detected activates charge pump 26, which charges or discharges capacitance in low-pass filter 29. When a phase difference is detected by phase detector 24, charge pump 26 charges or discharges low-pass filter 29, which increases or decreases the voltage VMAX input to VCO 20. A higher or lower VMAX voltage input to VCO 20 causes the frequency FMAX output by VCO 20 to increase or decrease slightly. The clock from VCO 20 is then divided by N+R by divider 28 and input to phase detector 24.

For PLL loop 70, phase detector 34 also receives the divided reference clock and compares it with a loop feedback clock from divider 38. The phase difference detected activates charge pump 36, which charges or discharges capacitance in low-pass filter 39. When a phase difference is detected by phase detector 34, charge pump 36 charges or discharges low-pass filter 39, which increases or decreases the VMIN voltage input to VCO 30. A higher or lower VMIN voltage input to VCO 30 causes the frequency FMIN output by VCO 30 to increase or decrease slightly. The clock from VCO 30 is then divided by N by divider 38 and input to phase detector 34.

The two PLL loops 60, 70 operate in the same way, except that divider 28 divides by (N+R) while divider 38 divided by N. Normally R is much smaller than N, so that N+R is slightly larger than N. Dividers 28, 38 effectively multiply the reference clock frequency since they are in the feedback loop. The larger feedback divisor in loop 60 reduces the frequency of the clock input to phase detector 24. To compensate, loop 60 slightly increases the VCO input voltage VMAX, slightly increasing the clock frequency FMAX from VCO 20. This locks loop 60 to a slightly higher frequency than loop 70.

The frequency output by VCO 30 in second loop 70 is FMIN=FREF*N/M, while the frequency output by VCO 20 in first loop 60 is FMAX=FREF*(N+R)/M. FMAX is slightly larger than FMIN. M, N, and R are whole numbers.

Loops 60, 70 are connected together by DAC 54. The reference-voltage input terminals −Vref, +Vref of DAC 54 are connected to the VCO input voltages VMAX from loop 60 and VMIN from loop 70. VCO input voltage VMIN is thus the DAC's −Vref input, while VCO input voltage VMAX is the DAC's +Vref input.

The output voltage of DAC 54 is selectable from among many quantized values between the reference voltages −Vref, +Vref. For example, when the digital DAC code-word input to DAC 54 is a K-bit signal, the range −Vref to +Vref is divided into $2^K-1$ equal voltage intervals of $2*Vref/(2^K-1)$ volts per interval. For K=8 bits, there are 255 intervals.

The output voltage of DAC 54 is coupled to the input of final VCO 40. Final VCO 40 converts the output voltage to a frequency FOUT of the output clock. Since the DAC output voltage is somewhere between it's reference-voltage inputs connected to VMAX and VMIN, the frequency output FOUT is between FMAX and FMIN.

The exact frequency generated depends on the digital DAC code, which is a K-bit digital signal or code-word. The DAC code represents a selected fraction of the total voltage range VMIN to VMAX. DAC 54 outputs this fraction of the full voltage range VMIN to VMAX as its output voltage.

The output frequency produced is FOUT=FMIN+(FMAX-FMIN)*CW/$(2^K-1)$, where CW is the binary value of the K-bit DAC code-word input. When the code-word input is all zeros (00000000), DAC 54 outputs its −Vref, the voltage VMIN from loop 70, and FOUT=FMIN. When the code-word input is all ones (11111111), DAC 54 itputs its +Vref, the voltage VMAX from loop 60, and FOUT=FMAX. Otherwise, the output frequency produced is a function of the value of the code-word CW input to DAC 54. For example, an 8-bit code-word of 00001111 produces an output voltage about half-way between VMIN and VMAX, while a code-word of 00000011 produces an output voltage about one-sixteenth of the full range, near VMIN.

DAC 54 can be constructed from a variety of DAC technologies, such as current-source switching, capacitor-switching, charge-sharing, or various combinations. More precise DAC's with larger values of K can be used to more precisely divide the input-voltage range, and thus more precisely determine the output voltage and frequency. Less expensive DAC's, such as 4 or 8-bit DAC's, can still produce a finely-tuned clock, especially when R is small and VMIN and VMAX are close to each other.

Figure 3:
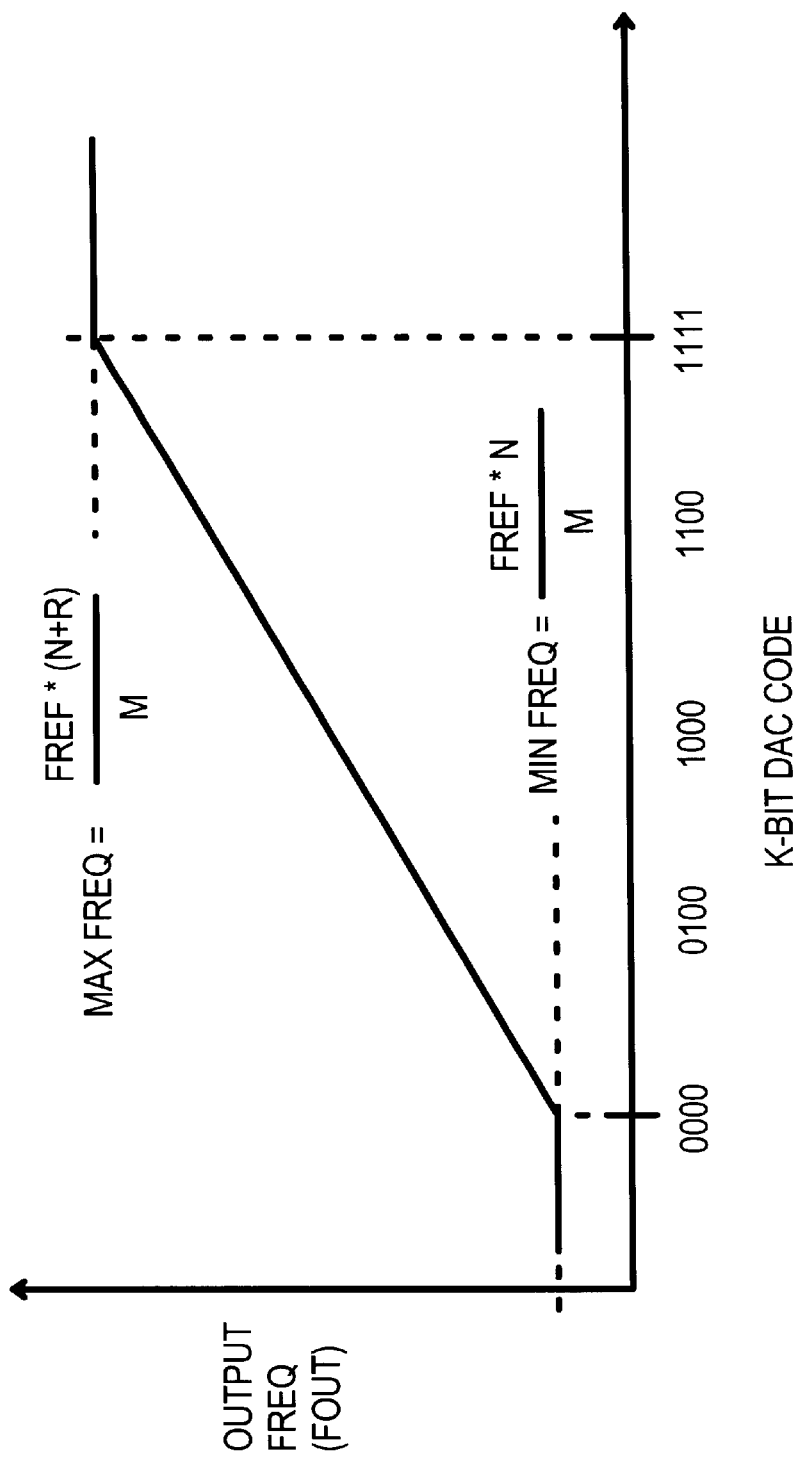
FIG. 3 is a graph showing how output frequency varies with the digital code-word input to the DAC.

Frequency Varies with DAC Code-Word Input—FIG. 3

FIG. 3 is a graph showing how output frequency varies with the digital code-word input to the DAC. The output frequency FOUT is shown along the y-axis, while the N-bit digital code-word input to the DAC is shown on the x-axis. In this simplified example, a 4-bit DAC code-word is shown.

The output frequency is a linear function of the code-word. FOUT is the minimum frequency of the second PLL loop, FMIN or FREF*N/M, selected by a code-word of 0000, when the DAC outputs the −Vref input voltage is taken from the VCO input voltage of the second PLL loop. FOUT is the maximum frequency of the first PLL loop, FMAX or FREF*(N+R)/M, for a code-word of 1111, which causes the DAC to select its output voltage as the +Vref input voltage taken from the VCO input voltage of the first PLL loop.

Any desired output frequency can be obtained between FMIN and FMAX by selecting the DAC code-word to an appropriate value. For example, an output frequency of (FMAX+FMIN)/2 is obtained by selecting the code-word at the middle value (1000). Other output frequency values can be obtained by inputting DAC code-words representing an appropriate fraction of the total voltage range.

A DAC requires that the possible selections of output voltages be quantized. For example, the output voltage can be selected from any one of 64 locations using a 6-bit digital code-word.

ADVANTAGES OF THE INVENTION

A finely-tuned output frequency is obtained without requiring any change to the reference frequency. A fixed reference frequency can be used. The dual-PLL circuit uses the fixed reference frequency input, but can generate a range of finely-tuned output frequencies. The DAC can be constructed from standard technologies such as current switching through a resistor and can easily be integrated with the transistors in the PLL loops. A high level of integration is possible, allowing the dual-PLL clock generator to be integrated with other large-scale-integration systems such as microprocessors and complex communication chips.

Digital tuning of the output frequency is achieved by selection of the digital code-word. The digital code word selects from a range of possible output frequencies. The output frequency is digitally tuned without requiring any change to the reference frequency. Digital adjustment of the output frequency is obtained. Of course, the advantages and benefits described may not apply to all embodiments of the invention.

ALTERNATE EMBODIMENTS

Several other embodiments are contemplated by the inventor. For example, a variety of codings besides binary can be used for the digital code-word input to the DAC. Many different DAC and PLL technologies may be used.

Low pass filters 29, 39 can be simple R-C networks that smooth out clock variations over several loop periods. Other kinds of filters and variations can be used as well. The output VCO could have a different voltage-to-frequency function than the VCO's in the first and second PLL loops. The output frequency would still be selectable between two endpoint frequencies that are determined by the VCO input voltages as if they were input to loop VCO's having the same voltage-to-frequency function as the output VCO. The reference clock could be divided for input to one PLL loop, but not divided to the other PLL loop. While determining the output frequency is more complex, the principles of the invention can still be applied. The output frequency could also be determined empirically if necessary. Non-linear VCO's may be used.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A dual-loop digitally-tuned clock generator comprising:
   a reference-clock input, having a reference frequency;
   a first phase-locked loop, receiving the reference-clock input, for generating a first feedback clock having a first feedback frequency, the first phase-locked loop phase comparing the reference-clock input to the first feedback clock, the first phase-locked loop charging and discharging a first capacitance in response to phase comparison to adjust a first voltage;
   a second phase-locked loop, receiving the reference-clock input, for generating a second feedback clock having a second feedback frequency, the second phase-locked loop phase comparing the reference-clock input to the second feedback clock, the second phase-locked loop charging and discharging a second capacitance in response to phase comparison to adjust a second voltage;
   wherein the second voltage differs from the first voltage;
   a digital-to-analog converter (DAC) coupled between the first voltage and the second voltage, the DAC for generating a selectable voltage, wherein the selectable voltage is a voltage between the first voltage and the second voltage, the selectable voltage being selectable by a digital select input to the DAC; and
   an output-clock generator, coupled to the DAC by selectable voltage, for generating an output clock having an output frequency, the output frequency determined by the selectable voltage,
   whereby the output frequency is determined by the selectable voltage of the DAC coupled between the first and second phase-locked loops.

2. The dual-loop digitally-tuned clock generator of claim 1 wherein the first phase-locked loop has a first voltage-controlled oscillator (VCO) that receives the first voltage, the first VCO generating a first clock having a first frequency;
   wherein the second phase-locked loop has a second VCO that receives the second voltage, the second VCO generating a second clock having a second frequency;
   whereby the first and second phase-locked loops use VCOs to generate clocks.

3. The dual-loop digitally-tuned clock generator of claim 2 wherein the output frequency is selectable between the first frequency and the second frequency,
   whereby the output frequency is an intermediate frequency.

4. The dual-loop digitally-tuned clock generator of claim 2 wherein the first phase-locked loop further has a first divider, coupled to an output of the first VCO, for dividing the first frequency to generate the first feedback clock;
   wherein the second phase-locked loop further has a second divider, coupled to an output of the second VCO, for dividing the second frequency to generate the second feedback clock,
   whereby dividers generate feedback clocks.

5. The dual-loop digitally-tuned clock generator of claim 4 wherein the second divider divides by a larger divisor than the first divider,
   whereby different feedback divisors are used by the first and second phase-locked loops.

6. The dual-loop digitally-tuned clock generator of claim 2 wherein the output-clock generator is a third VCO that generates the output clock with the output frequency being a function of the selectable voltage,
   whereby the output clock is generated by the third VCO.

7. The dual-loop digitally-tuned clock generator of claim 6 wherein the DAC further comprises:
   maximum reference-voltage input, coupled to the first voltage from the first phase-locked loop;
   a minimum reference-voltage input, coupled to the second voltage from the second phase-locked loop;
   whereby the DAC generates the selectable voltage from the first and second voltages.

8. The dual-loop digitally-tuned clock generator of claim 7 wherein the selectable voltage is selected from a plurality of voltages generated by the DAC, the plurality of voltages being separated by equal voltage intervals,
   whereby the selectable voltage of the DAC is selected from equally divided voltage intervals by the DAC.

9. The dual-loop digitally-tuned clock generator of claim 8 wherein the output frequency is selected as a linear function having endpoints determined by the first and second frequencies.

10. The dual-loop digitally-tuned clock generator of claim 9 further comprising:
    an input divider, receiving a primary-input clock, for dividing the primary-input clock to generate the reference-clock input having the reference frequency,
    whereby the primary-input clock is divided.

11. The dual-loop digitally-tuned clock generator of claim 10 wherein the first phase-locked loop further comprises a first charge pump, responsive to phase comparison by the first phase-locked loop, for charging and discharging the first capacitance;
    wherein the second phase-locked loop further comprises a second charge pump, responsive to phase comparison by the second phase-locked loop, for charging and discharging the second capacitance.

12. The dual-loop digitally-tuned clock generator of claim 11 wherein the first capacitance is in a first low-pass filter that has a first resistance, and the second capacitance is in a second low-pass filter that has a second resistance.

13. A dual phase-locked loop (PLL) variable-frequency clock generator comprising:
- a fixed-frequency clock input;
- a first PLL, receiving the fixed-frequency clock input, for generating a first voltage on a first node, the first voltage determining a first frequency of the first PLL;
- a second PLL, receiving the fixed-frequency clock input, for generating a second voltage on a second node, the second voltage determining a second frequency of the second PLL;
- a digital-to-analog converter (DAC), coupled between the first and second PLL, connected to the first node at a first reference-voltage terminal of the DAC, and connected to the second node at a second reference-voltage terminal of the DAC, the DAC for selecting a final voltage from voltages between the first voltage and the second voltage;
- a final voltage-controlled oscillator (VCO), receiving the final voltage from the DAC, for generating a final clock having a final frequency that is determined by the final voltage input to the final VCO; and
- whereby the final frequency is selectable by the DAC that generates the final voltage between the first and second voltages generated as DAC reference voltages by the first and second PLL's.

14. The dual PLL variable-frequency clock generator of claim 13 wherein the first PLL comprises:
- a first phase comparator, receiving the fixed-frequency clock input and a first feedback clock, for comparing phases of the fixed-frequency clock and the first feedback clock;
- a charge pump, responsive to the first phase comparator, for charging and discharging the first node in response to a phase difference between the fixed-frequency clock and the first feedback clock;
- a first VCO, coupled to the first node, for generating a first clock having a first frequency determined by the first voltage;
- a first feedback divider, receiving the first clock, for generating the first feedback clock;

wherein the second PLL comprises:
- a second phase comparator, receiving the fixed-frequency clock input and a second feedback clock, for comparing phases of the fixed-frequency clock and the second feedback clock;
- a charge pump, responsive to the second phase comparator, for charging and discharging the second node in response to a phase difference between the fixed-frequency clock and the second feedback clock;
- a second VCO, coupled to the second node, for generating a second clock having a second frequency determined by the second voltage;
- a second feedback divider, receiving the second clock, for generating the second feedback clock,
- whereby the first and second VCO determine frequencies of the first and second clocks.

15. The dual PLL variable-frequency clock generator of claim 14 wherein the first PLL further comprises a first low-pass filter, coupled to the first node, for filtering phase differences among several clock periods;

wherein the second PLL further comprises a second low-pass filter, coupled to the second node, for filtering phase differences among several clock periods, whereby low-pass filtering is performed.

16. The dual PLL variable-frequency clock generator of claim 15 wherein the second feedback divider divides the second clock by N, wherein N is a whole number, while the first feedback divider divides the first clock by N+R, wherein R is a whole number that is smaller than N, whereby the first PLL divides by a larger number than the second PLL, causing the first voltage to be greater than the second voltage.

17. The dual PLL variable-frequency clock generator of claim 16 wherein the DAC receives an K-bit digital input, wherein K is a whole number, the DAC for dividing a voltage range between the first voltage and second voltage into a plurality of $2^K-1$ voltage intervals, the DAC selecting a voltage from among the voltage intervals in response to the K-bit digital input.

18. A variable-frequency clock generator comprising:
- clock input means for receiving a reference clock having a reference frequency;
- first loop means, receiving the reference clock, for locking a first feedback clock to the reference clock by adjusting a first voltage of a first node;
- second loop means, receiving the reference clock, for locking a second feedback clock to the reference clock by adjusting a second voltage of a second node;
- wherein the first and second voltage are not equal in voltage;
- digital-to-analog converter (DAC) means, having a digital input, a first analog voltage input coupled to the first node, and a second analog voltage input coupled to the second node, for converting the digital input into one of a plurality of different voltages having values from the first voltage to the second voltage, the DAC generating as an output voltage one of the plurality of different voltages in response to the digital input; and
- output clock means, responsive to the DAC means, for generating an output clock having an output frequency that is determined by the output voltage generated by the DAC means,
- whereby the output frequency is determined by the DAC means and the first and second loop means.

19. The variable-frequency clock generator, of claim 18 wherein the output clock means comprises voltage-controlled oscillator (VCO) means for converting the output voltage to the output clock having the output frequency being a predetermined function of the output voltage.

20. The variable-frequency clock generator of claim 19 wherein the first loop means comprises:
- first phase compare means, receiving the reference clock and the first feedback clock, for comparing clock phases;
- first charge means, responsive to a phase difference from the first phase compare means, for increasing and decreasing the first voltage;
- first VCO means, responsive to the first voltage, for generating a first clock with a first frequency being a predetermined function of the first voltage;
- first feedback divider means, receiving the first clock, for generating the first feedback clock;

wherein the second loop means comprises:
- second phase compare means, receiving the reference clock and the second feedback clock, for comparing clock phases;

second charge means, responsive to a phase difference from the second phase compare means, for increasing and decreasing the second voltage;

second VCO means, responsive to the second voltage, for generating a second clock with a second frequency being a predetermined function of the second voltage;

second feedback divider means, receiving the second clock, for generating the second feedback clock;

wherein the first and second feedback divider means divide by different values.

* * * * *